US011296661B2

(12) United States Patent
Wakaki

(10) Patent No.: US 11,296,661 B2
(45) Date of Patent: Apr. 5, 2022

(54) AMPLIFIER CIRCUIT

(71) Applicant: Murata Manufacturing Co., Ltd., Kyoto (JP)

(72) Inventor: Ken Wakaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 16 days.

(21) Appl. No.: 16/822,146

(22) Filed: Mar. 18, 2020

(65) Prior Publication Data
US 2020/0304079 A1 Sep. 24, 2020

(30) Foreign Application Priority Data

Mar. 20, 2019 (JP) .............................. JP2019-052584

(51) Int. Cl.
*H03F 3/187* (2006.01)
*H03F 3/195* (2006.01)
*H03F 1/56* (2006.01)

(52) U.S. Cl.
CPC ............. *H03F 3/195* (2013.01); *H03F 1/565* (2013.01)

(58) Field of Classification Search
CPC ............... H03F 3/187; H03F 1/22; H03F 1/42
USPC .................................................. 330/307, 311
See application file for complete search history.

(56) References Cited

U.S. PATENT DOCUMENTS 7,755,435 B2 * 7/2010 Lu ............................ H03F 1/42
330/311

FOREIGN PATENT DOCUMENTS

JP H08-321726 A 12/1996
JP H10-303661 A 11/1998

* cited by examiner

*Primary Examiner* — Henry Choe
(74) *Attorney, Agent, or Firm* — Pearne & Gordon LLP

(57) ABSTRACT

An amplifier circuit that amplifies a high frequency signal includes a transistor that is an example of an amplifier integrated into an IC device and an inductor connected to an input terminal of the transistor, and the inductor includes a first inductor integrated into the IC device and a second inductor connected in series to the first inductor and included in a first component different from the IC device.

15 Claims, 8 Drawing Sheets

AMPLIFIER CIRCUIT

This application claims priority from Japanese Patent Application No. 2019-052584 filed on Mar. 20, 2019. The content of this application is incorporated herein by reference in its entirety.

BACKGROUND OF THE DISCLOSURE

1. Field of the Disclosure

The present disclosure relates to an amplifier circuit.

2. Description of the Related Art

To date, amplifier circuits that amplify high frequency signals are known. For example, Japanese Unexamined Patent Application Publication No. 8-321726 discloses a monolithic microwave integrated circuit (MMIC) amplifier circuit including a matching circuit connected to an amplifier on the input side of the amplifier.

BRIEF SUMMARY OF THE DISCLOSURE

In the amplifier circuit in the related art, the inductor connected in series to the amplifier on the input side is composed of a spiral inductor integrated into the IC (integrated circuit). In the spiral inductor integrated into the IC, restriction on the wiring line thickness or the like makes it difficult to reduce a parasitic resistance component. This leads to a low Q factor of the spiral inductor integrated into the IC, and thus the noise figure (hereinafter, referred to as NF) of the amplifier circuit is deteriorated.

In contrast, if the inductor connected in series to the amplifier on the input side is formed by using an external component such as a chip component different from the IC having the amplifier circuit formed therein, a high Q factor of the inductor is achievable. However, being influenced by parasitic capacitance appearing in a portion where the IC and the external component are connected, the input impedance of the amplifier is likely to be lowered. In the case where the input impedance is lowered, for example, the input impedance of the amplifier needs to be raised such as by making larger the inductor connected to the source terminal of a field effect transistor (FET) included in the amplifier. However, in this case, the characteristics such as the amplification factor of the amplifier circuit are deteriorated.

Accordingly, it is an object of the present disclosure to provide an amplifier circuit enabled to restrain the deterioration of an NF and an amplification factor.

To achieve the object, according to an aspect of the present disclosure, an amplifier circuit that amplifies a high frequency signal includes an amplifier and an inductor connected in series to an input terminal of the amplifier. The amplifier is integrated in an IC device, and the inductor includes a first inductor integrated into the IC device and a second inductor connected in series to the first inductor and included in the component.

The amplifier circuit according to an embodiment of the present disclosure can restrain the deterioration of the NF and the amplification factor.

Other features, elements, characteristics and advantages of the present disclosure will become more apparent from the following detailed description of preferred embodiments of the present disclosure (with reference to the attached drawings).

DETAILED DESCRIPTION OF THE DISCLOSURE

Figure 1:
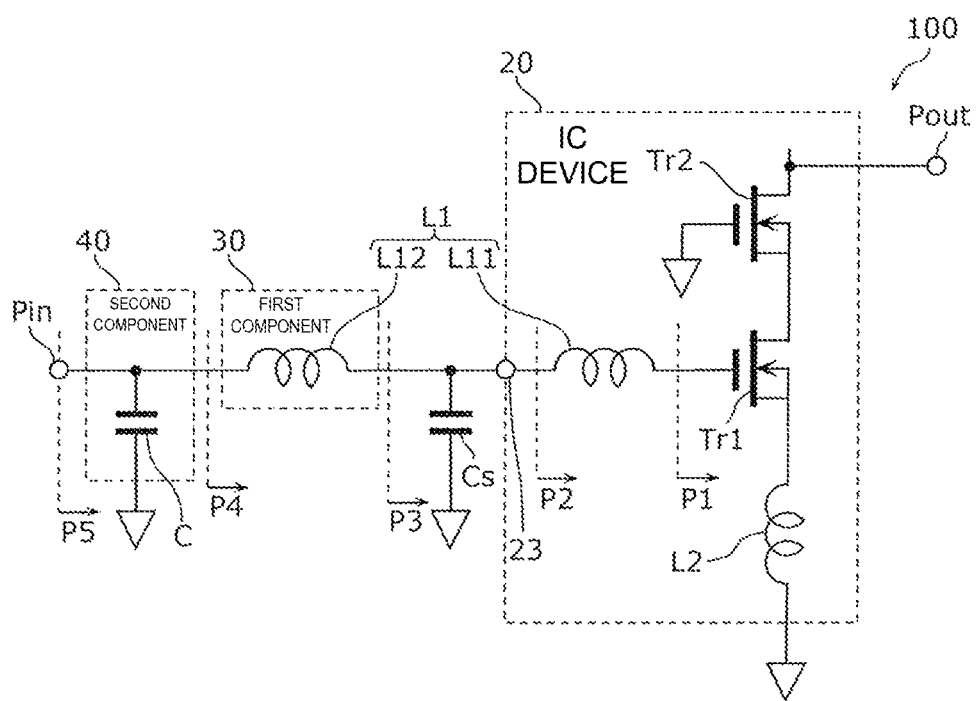
FIG. 1 is a circuit diagram of an amplifier circuit according to Embodiment 1.

Hereinafter, amplifier circuits according to embodiments of the present disclosure will be described in detail by using the drawings. Note that each embodiment to be described later represents a specific example. Accordingly, a numeric value, a shape, a material, a component, the arrangement and connection form of the component, a step, the order of steps, and the like described in the following embodiments are an example and are not intended to limit the present disclosure. Among components in the following embodiments, a component that is not described in an independent claim is thus described as an optional component.

The drawings are schematic drawings and thus are not necessarily illustrated precisely. Accordingly, for example, reduced scales or the like in the respective drawings do not necessarily correspond to each other. Substantially the same components in the drawings are denoted by the same reference numerals, and overlapping explanation is omitted or simplified.

In this specification, terms representing a relationship between elements such as the terms "parallel" and "perpendicular", terms representing the shape of an element, and the range of numerical values are not used as expressions used only in a strict sense but are used as expressions representing a substantially equivalent range, for example, inclusion of a several percentage difference.

Embodiment 1

1. Configuration

First, the configuration of an amplifier circuit according to Embodiment 1 will be described by using FIGS. 1 and 2.

FIG. 1 is a circuit diagram of an amplifier circuit 100 according to this embodiment. FIG. 2 is a cross-sectional view illustrating the configuration of the amplifier circuit 100 according to this embodiment. In FIG. 2, for easy-to-understand explanation, only some components (specifically, a ground electrode 50, bonding pads 60, 61, and 62, and bumps 70) are shaded to represent a cross section. In addition, FIG. 1 illustrates locations denoted by P1 to P5 serving as reference for observing the input impedance of an amplifier. The same holds true for FIGS. 3, 8, and 9 described later.

The amplifier circuit 100 amplifies a high frequency signal. The high frequency signal is a signal conforming to a communication standard such as Long Term Evolution (LTE). The amplifier circuit 100 is an amplifier circuit that is connected to, for example, an antenna element and that amplifies a high frequency signal received by the antenna element. The amplifier circuit 100 is disposed, for example, in the front-end portion of a multimode and or multiband compatible mobile phone.

As illustrated in FIG. 1, the amplifier circuit 100 includes a transistor Tr1, a transistor Tr2, an inductor L1, an inductor L2, a capacitor C, an input terminal Pin, and an output terminal Pout. To the input terminal Pin, for example, an antenna element (not illustrated) is connected. To the output terminal Pout, a radio frequency integrated circuit (RFIC) or the like is connected, for example, with a switch circuit interposed therebetween.

A parasitic capacitance Cs appears between an IC input terminal 23 of an IC device 20 and the ground electrode 50, and this will be described in detail by using FIG. 2 later. As illustrated in FIG. 1, the amplifier circuit 100 thus includes the parasitic capacitance Cs.

The amplifier circuit 100 also includes a DC cut capacitor but is not illustrated in FIG. 1. The DC cut capacitor is connected in series, for example, between the input terminal Pin and the input terminal of the transistor Tr1.

In this embodiment, the transistor Tr1, the transistor Tr2, and the inductor L2 form an amplifier integrated into the IC device 20. The amplifier is, for example, a low-noise amplifier (LNA).

The transistor Tr1 is an example of an amplifier element included in the amplifier, and is, for example, a transconductance element. For example, the transistor Tr1 is a FET. Specifically, the transistor Tr1 is a metal organic semiconductor field effect transistor (MOSFET). In this embodiment, the transistor Tr1 is an n-channel MOSFET.

The gate of the transistor Tr1 is the input terminal of the amplifier and connected to the inductor L1. The drain of the transistor Tr1 is connected to the source of the transistor Tr2. The source of the transistor Tr1 is grounded with the inductor L2 interposed between the transistor Tr1 and the ground. Specifically, the inductor L2 is connected in series between the source of the transistor Tr1 and the ground electrode 50.

Note that instead of the inductor L2, at least one of a capacitor and a resistive element may be connected in series. Alternatively, at least one of a capacitor and a resistive element may be connected in parallel or in series to the inductor L2. The capacitor and the resistive element may be connected in series or parallel to each other. The source of the transistor Tr1 may be directly grounded without the inductor L2.

The transistor Tr2 is an example of an amplifier element included in the amplifier and has the same configuration as that of the transistor Tr1. For example, the transistor Tr2 is an n-channel MOSFET. The transistor Tr2 may have a configuration different from that of the transistor Tr1.

The gate of the transistor Tr2 is grounded. Specifically, the gate of the transistor Tr2 is high frequency grounded. The drain of the transistor Tr2 is connected to the output terminal Pout of the amplifier circuit 100. The drain of the transistor Tr2 is connected to a bias circuit that supplies a bias voltage, which is not illustrated in FIG. 1. In this embodiment, cascading connection is performed between the transistor Tr1 and the transistor Tr2.

The configuration of the amplifier integrated into the IC device 20 is not limited to the example illustrated in FIG. 1. For example, the transistor Tr2 does not have to be provided.

The inductor L1 is a series inductor connected to the input terminal of the amplifier. The inductor L1 is provided for impedance matching on the input side of the amplifier. As illustrated in FIG. 1, the inductor L1 is connected to the input terminal Pin of the amplifier circuit 100 at one end of the inductor L1 and to the gate of the transistor Tr1 at the other end.

In this embodiment, the inductor L1 is divided into two. A part of the inductor L1 is integrated into the IC device 20, and the remaining part is included in a first component 30. Specifically, as illustrated in FIG. 1, the inductor L1 includes a first inductor L11 and a second inductor L12. The first inductor L11 and the second inductor L12 are connected in series to each other.

The first inductor L11 is a part of the inductor L1 connected in series to the amplifier and is integrated into the IC device 20. The first inductor L11 is, for example, a spiral inductor formed on the circuit board of the IC device 20. The first inductor L11 is connected to the gate of the transistor Tr1 at one end of the first inductor L11 and to the second inductor L12 at the other end.

The second inductor L12 is the remaining part of the inductor L1 and is not integrated into the IC device 20. The second inductor L12 is included in the first component 30. The second inductor L12 is, for example, a chip inductor. The second inductor L12 is connected to the input terminal Pin of the amplifier circuit 100 at one end of the second inductor L12 and to the first inductor L11 at the other end.

The inductance value of the inductor L1 is determined based on the frequency band of a high frequency signal amplified by the amplifier circuit 100. Specifically, the higher the frequency band of the high frequency signal, the smaller the inductance value. For example, in a case where the frequency band of the high frequency signal is the 1 GHz band, the inductance value of the inductor L1 is about 20 nH. For example, in a case where the frequency band of the high frequency signal is the 2.5 GHz band, the inductance value of the inductor L1 is about 10 nH. For example, in a case where the frequency band of the high frequency signal is the 5 GHz band, the inductance value of the inductor L1 is about 5 nH.

In this embodiment, the inductance value of the first inductor L11 is equal to or smaller than the inductance value of the second inductor L12. Specifically, the inductance value of the first inductor L11 is smaller than the inductance value of the second inductor L12. For example, the inductance value of the first inductor L11 is equal to or smaller than half of the inductance value of the second inductor L12. Alternatively, the inductance value of the first inductor L11 may be equal to or smaller than ¼ of the inductance value of the second inductor L12. In an example, the inductance value of the first inductor L11 is about 1 nH, and the inductance value of the second inductor L12 is about 4 nH.

The capacitor C is a shunt capacitor grounded at one end thereof. The other end of the capacitor C is connected to the input terminal Pin of the amplifier circuit 100. The capacitor C is included in, for example, a second component 40. The capacitor C is, for example, a multilayer ceramic capacitor.

The capacitor C is provided to obtain the predetermined values of the input impedance of the amplifier circuit 100. As the predetermined values, for example, the resistance component has 50 ohms, and the reactance component has 0 ohms. The capacitance value of the capacitor C ranges from, for example, about 0.3 pF to about 0.6 pF but is not limited to these.

In this embodiment, the parasitic capacitance Cs is present between the first inductor L11 and the second inductor L12. The parasitic capacitance Cs inevitably appears due to a bonding pad used for the mounting of the IC device 20. Specifically, the parasitic capacitance Cs appears between the ground electrode 50 and the wiring line connecting the first inductor L11 and the second inductor L12.

Hereinafter, a specific structure of the amplifier circuit 100 causing the parasitic capacitance Cs will be described.

Figure 2:
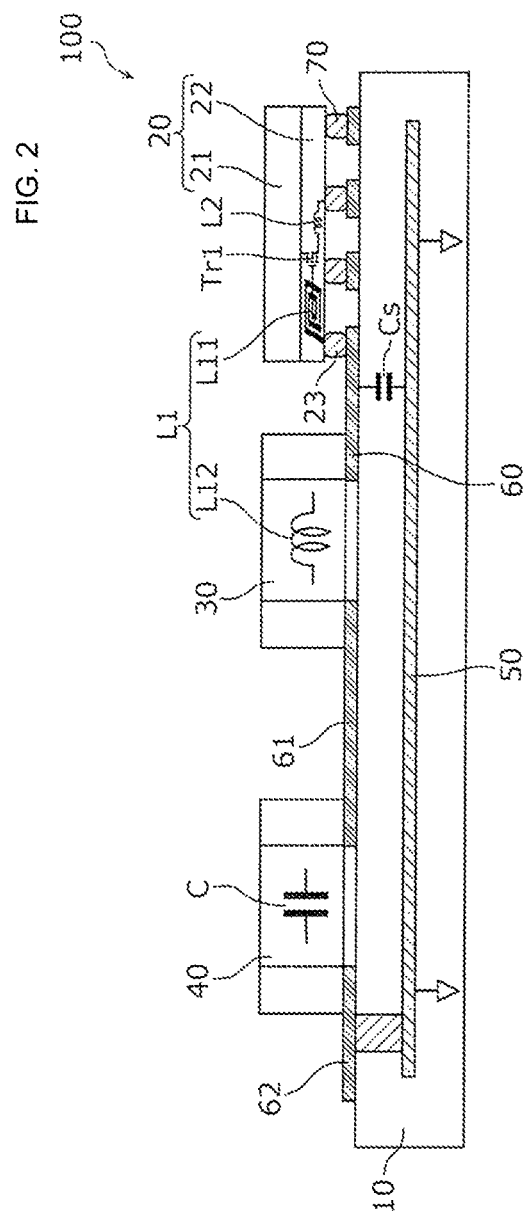
FIG. 2 is a cross-sectional view illustrating the configuration of the amplifier circuit according to Embodiment 1.

As illustrated in FIG. 2, the amplifier circuit 100 includes a substrate 10, the IC device 20, the first component 30, the second component 40, the ground electrode 50, the bonding pads 60, 61, and 62, and the plurality of bumps 70.

The substrate 10 is an example of a mounting substrate where the IC device 20, the first component 30, and the second component 40 are mounted. The substrate 10 is, for example, a multilayer substrate having a plurality of stacked layers. The substrate 10 is, for example, a printed circuit board (PCB) or a ceramic multilayer substrate. For example, a low temperature co-fired ceramic (LTCC) substrate is usable as the ceramic multilayer substrate. The substrate 10 may also be a multilayer substrate formed by combining thermoplastic resin or thermosetting resin with a metal material.

The IC device 20 is an integrated circuit for an amplifier. Specifically, the IC device 20 is manufactured in a process using a silicon on insulator (SOI) semiconductor substrate. The IC device 20 includes, for example, a high resistance silicon (Si) substrate 21 functioning as a circuit board and further includes a trap-rich layer, an insulating layer also called a buried oxide (BOX) layer, and a Si layer 22 for functions that are disposed in order above the high resistance Si substrate 21. Note that in FIG. 2, the illustration of the trap-rich layer and the insulating layer is omitted.

In the IC device 20, the amplifier is disposed, for example, inside or on the surface of the Si layer 22. Specifically, as illustrated in FIG. 2, the transistor Tr1, the transistor Tr2 (not illustrated), and the inductor L2 are disposed inside or on the surface of the Si layer 22. In this embodiment, the first inductor L11 is further disposed inside or on the surface of the Si layer 22. The surface of the Si layer 22 faces the mounting surface of the substrate 10.

If the amplifier circuit 100 includes the DC cut capacitor, the DC cut capacitor is also included in the IC device 20 together with the transistor Tr1, the transistor Tr2, the inductor L2, and the first inductor L11. The DC cut capacitor is connected in series to, for example, the first inductor L11 and the gate of the transistor Tr1. Alternatively, the DC cut capacitor may be connected in series to the IC input terminal 23 and the first inductor L11.

The IC device 20 may be manufactured in a process using a Si substrate called a bulk CMOS in accordance with the used frequency band and performance requirements. Alternatively, the IC device 20 may be manufactured in a process using a compound semiconductor such as GaAs.

In FIG. 2, only the IC input terminal 23 of the IC device 20 is clearly depicted. However, the IC device 20 is provided with an output terminal for connecting to the output terminal Pout of the amplifier circuit 100, a power supply terminal for receiving a bias voltage of the amplifier, a ground terminal for connecting to the ground electrode 50, and the like that are not clearly depicted in FIG. 2. Each terminal is connected to the corresponding bonding pad of the mounting surface with the corresponding bump 70 interposed therebetween.

The IC device 20 is mounted above the substrate 10 with the plurality of bumps 70 interposed therebetween. At this time, the surface of the Si layer 22 of the IC device 20 is parallel to the mounting surface of the substrate 10. Examples of the mounting of the IC device 20 include flip-chip mounting, face-down mounting, and chip size package (CSP) mounting; however, the mounting technologies are not limited to these. The plurality of bumps 70 are, for example, solder bumps. The first component 30 and the second component 40 are mounted above the substrate 10 with solder interposed therebetween. For example, the IC device 20, the first component 30, and the second component 40 are reflown simultaneously and thereby mounted above the substrate 10.

The IC device 20 after the reflow may be molded by using one or more types of thermosetting resin or the like. A metal film may also be disposed on the surface of the resin to thereby provide an electromagnetic shielding function. The metal film is formed by using one or more types of metals such as titanium, copper, or nickel. Not only the IC device 20 but also the first component 30 and the second component 40 may be molded by using the resin. Alternatively, the IC device 20, the first component 30, and the second component 40 may be molded collectively by using the resin.

The first component 30 is an external component different from the IC device 20. In this embodiment, the first component 30 includes the second inductor L12 that is a part of the inductor L1. The first component 30 is a chip component or an integrated passive device (IPD).

The second component 40 is an external component different from the IC device 20. In this embodiment, the second component 40 includes the capacitor C. The second component 40 is a chip component or an IPD.

The ground electrode 50 is disposed, for example, inside the substrate 10. Note that the ground electrode 50 may be disposed on a surface opposite to the mounting surface of the substrate 10. Alternatively, the ground electrode 50 may be disposed on the mounting surface of the substrate 10. The ground electrode 50 is formed from a metal material such as copper.

The bonding pads 60, 61, and 62 are disposed on the mounting surface of the substrate 10, and the terminals of the components mounted above the substrate 10 are connected thereto. The bonding pad 60 is a conductive pattern connected to the respective terminals of the IC device 20 and the first component 30 when the IC device 20 and the first component 30 are mounted above the substrate 10. The bonding pad 60 also functions as a wiring line electrically connecting the first inductor L11 integrated into the IC device 20 and the second inductor L12 included in the first component 30.

The bonding pad 61 is a conductive pattern connected to the respective terminals of the first component 30 and the second component 40 when the first component 30 and the second component 40 are mounted above the substrate 10. The bonding pad 61 also functions as a wiring line electrically connecting the second inductor L12 included in the first component 30 and the capacitor C included in the second component 40.

The bonding pad 62 is a conductive pattern connected to the terminal of the second component 40. The bonding pad 62 also functions as a wiring line electrically grounding the capacitor C included in the second component 40.

As illustrated in FIG. 2, the parasitic capacitance Cs appears between the bonding pad 60 disposed on the mounting surface and the ground electrode 50. The bonding pad 60 corresponds to the wiring line electrically connecting the first inductor L11 and the second inductor L12. Accordingly, as illustrated in FIG. 1, the parasitic capacitance Cs serves as a capacitance connected in parallel to and between the ground electrode 50 and the point where the first inductor L11 and the second inductor L12 are connected.

Note that a bonding pad in this specification is not limited to the bonding pads disposed on the mounting surface of the substrate 10 as illustrated in FIG. 2 and denotes a conductive connection member covering a predetermined area for connection using a bonding wire, various bumps, solder, and the like.

With the bonding pad 60, the parasitic capacitance Cs can appear even without the ground electrode 50. For example, the parasitic capacitance Cs can also appear in such a portion as located between the bonding pad 60 and a different wiring portion adjacent to the bonding pad 60. That is, the amplifier circuit 100 does not have to include the ground electrode 50.

The parasitic capacitance Cs appears inevitably when the IC device 20 is mounted. The parasitic capacitance Cs influences the matching in the input impedance of the amplifier circuit 100 and thus leads to an increase in loss and the deterioration of the NF in the amplifier circuit 100 in Comparative Example 1 below.

2. Configuration and Trouble in Comparative Example 1

First, the configuration of an amplifier circuit according to Comparative Example 1 will be described by using FIG. 3.

Figure 3:
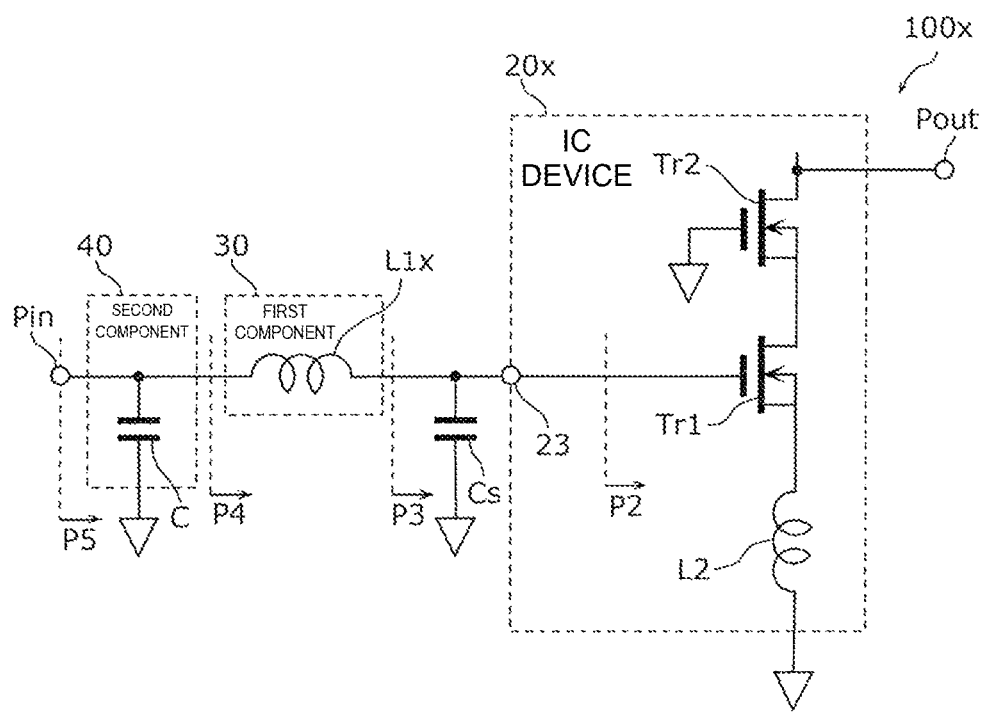
FIG. 3 is a circuit diagram of an amplifier circuit according to Comparative Example 1.

FIG. 3 is a circuit diagram of an amplifier circuit 100x according to Comparative Example 1. As illustrated in FIG. 3, the amplifier circuit 100x according to Comparative Example 1 is different from the amplifier circuit 100 according to Embodiment 1 in that an inductor is not integrated into an IC device 20x.

Specifically, as illustrated in FIG. 3, the amplifier circuit 100x includes an inductor L1x. The inductor L1x is a series inductor connected to the input terminal of the transistor Tr1 and is included in the first component 30. That is, the inductor L1x according to Comparative Example 1 is not divided into two, is entirely included in the external first component 30, and is not integrated into the IC device 20x. Accordingly, a high Q factor of the inductor L1x can be achieved.

However, the amplifier circuit 100x according to Comparative Example 1 has trouble in which the parasitic capacitance Cs appearing on the bonding pad of the IC device 20x causes an increase in the loss in the amplifier circuit 100x.

Figure 4:
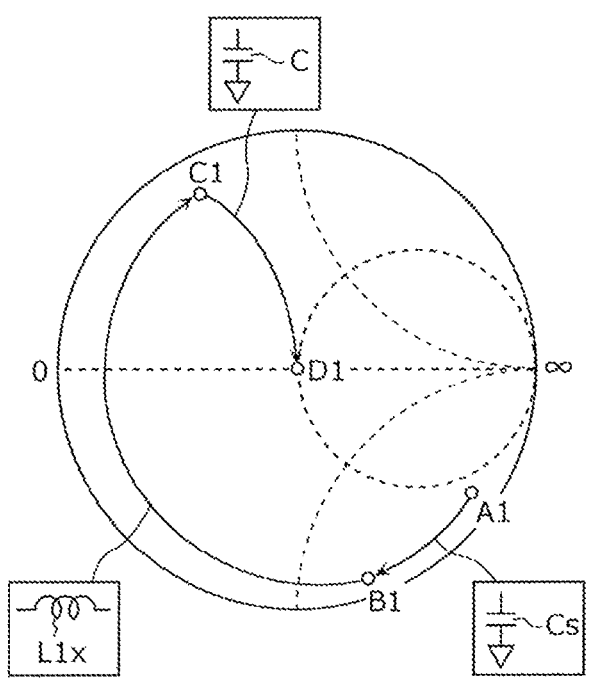
FIG. 4 is a Smith chart for explaining the input impedance matching in the amplifier circuit according to Comparative Example 1.

Subsequently, the trouble with the amplifier circuit 100x according to Comparative Example 1 will be described in detail by using FIG. 4. FIG. 4 is a Smith chart for explaining the input impedance matching in the amplifier circuit 100x according to Comparative Example 1.

Since the transistor Tr1 is a FET in the amplifier circuit 100x according to Comparative Example 1, the input impedance of the transistor Tr1 is localized on the conductance. Accordingly, as illustrated in FIG. 4, the input impedance of the transistor Tr1 observed from P2 is located at a location A1 close to the circumference of the Smith chart.

In the amplifier circuit 100x according to Comparative Example 1, the parasitic capacitance Cs appearing due to the influence of the bonding pad of the IC device 20x is connected in parallel to and between the gate (input terminal) of the transistor Tr1 and the ground electrode. Accordingly, the parasitic capacitance Cs causes the input impedance observed from P3 to move clockwise along the constant conductance circle from the location A1 to a location B1. The location B1 is closer to the circumference than the location A1 is.

Since the inductor L1x is connected in series to the gate of the transistor Tr1, the input impedance observed from P4 then moves clockwise along the constant resistance circle from the location B1 to a location C1. Lastly, the capacitor C causes the input impedance observed from P5 to move from the location C1 to a location D1 (for example, 50 ohms) at the center of the Smith chart.

Since the location B1 is located closer to the circumference than the location A1 is at this time in Comparative Example 1, the inductance value of the inductor L1x needed for moving the input impedance to the location C1 enabling matching in the capacitor C is raised. Accordingly, a series resistance component included in the inductor L1x causes an increase in loss in the amplifier circuit 100, and thus the NF is deteriorated.

The capacitance value of the capacitor C needed for moving from the location C1 to the location D1 is also raised. Since the impedance of the capacitor C is thus lowered, the ground connected to one end of the capacitor C influences the signal line from the input terminal Pin to the output terminal Pout more largely. Specifically, an unnecessary signal enters the signal line from the input terminal Pin to the output terminal Pout via the ground connected to one end of the capacitor C. This causes the NF deterioration. For example, the use of the capacitor C having capacitance of 0.5 pF causes the NF to increase by 0.2 dB. Further, the movement trajectory of impedance per spectrum space is lengthened, and thus the band width enabling the matching is reduced. That is, the band allowing the amplifier circuit 100x to operate with the favorable matching and gain is reduced.

Wire bonding for connecting the IC device 20x to the external first component 30 is also conceivable. However, also in this case, the bonding pad for connecting wires is disposed in the IC device 20x, and the parasitic capacitance Cs based on the bonding pad appears on the input terminal of the amplifier. Since the parasitic capacitance Cs is lower than that in the bump mounting, the trajectory from the location A1 to the location B1 is shortened in FIG. 4, but it is not possible, as illustrated in FIG. 4, to restrain the NF deterioration and the operating band reduction.

In addition, the need for a space for extending the wires leads to an increase in the height and the area of the amplifier circuit 100x, and thus downsizing is difficult. The occurrence of stray inductance due to the wires and the occurrence of inductive coupling between the wires deteriorate the isolation between the terminals. Accordingly, the amplifier circuit 100x operates unstably, or the gain is more likely to be reduced.

As described above, the inductor L1x is included in the external first component 30 in the amplifier circuit 100x according to Comparative Example 1, and thus the Q factor of the inductor L1x itself can be raised. However, as described above, the input impedance is likely to decrease, and thus there is trouble in which it is not possible to restrain an increase in loss, the NF deterioration, and the operating band reduction.

3. Advantageous Effects

To address the trouble with the amplifier circuit 100x according to Comparative Example 1 described above, a part of the inductor L1 is integrated into the IC device 20 in the amplifier circuit 100 according to this embodiment, and the remaining part is included in the external first component 30, as described above. Even if most components of the inductor L1 are external components, the decrease in the input impedance can thereby be restrained, and thus the increase in loss, the NF deterioration, and reduction in the operating band having the favorable matching and gain can be restrained.

Detailed description is hereinafter provided by using FIG. 5.

Figure 5:
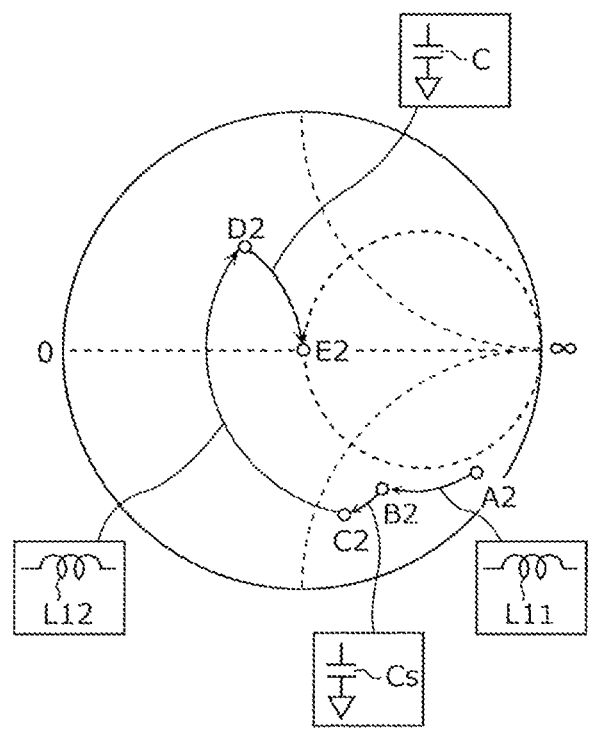
FIG. 5 is a Smith chart for explaining the input impedance matching in the amplifier circuit according to Embodiment 1.

FIG. 5 is a Smith chart for explaining the input impedance matching in the amplifier circuit 100 according to this embodiment. The input impedance of the gate of the transistor Tr1 is located in a location A2 and is the same as the location A1 illustrated in FIG. 4 in the case of the amplifier circuit 100x according to Comparative Example 1.

In the amplifier circuit 100 according to this embodiment, the first inductor L11 is connected in series to the gate of the transistor Tr1. Accordingly, as illustrated in FIG. 5, the input impedance observed from P2 moves clockwise along the constant resistance circle from the location A2 to a location B2. The location B2 is farther from the circumference than the location A2 is and is located closer to the center.

The parasitic capacitance Cs appearing due to the influence of the bonding pad 60 of the IC device 20 is connected in parallel to and between the first inductor L11 and the ground electrode 50. Accordingly, the parasitic capacitance Cs causes the input impedance observed from P3 to move clockwise along the constant conductance circle from the location B2 to a location C2. The location C2 is closer to the circumference than the location B2 is. However, the location B2 is closer to the center, and thus the trajectory of moving due to the parasitic capacitance Cs is shortened. Accordingly, as understood from the comparison between FIG. 4 and FIG. 5, the location C2 in FIG. 5 is located closer to the center than the location B1 in FIG. 4 is.

Since the second inductor L12 is connected in series to the first inductor L11 as illustrated in FIG. 5, the input impedance observed from P4 then moves clockwise along the constant resistance circle from the location C2 to a location D2. Lastly, the capacitor C causes the input impedance observed from P5 to move from the location D2 to a location E2 (for example, 50 ohms) at the center of the Smith chart.

Since the location C2 is located close to the center at this time in this embodiment, the inductance value of the second inductor L12 needed for moving the input impedance to the location D2 enabling the matching in the capacitor C is lowered. Accordingly, the increase in loss in the amplifier circuit 100 due to a series resistance component included in the second inductor L12 can be restrained.

Specifically, if the target impedance in this embodiment is the same as that in Comparative Example 1, the inductance value of the second inductor L12 is smaller than a value obtained by subtracting the inductance value of the first inductor L11 from the inductance value of the inductor L1x according to Comparative Example 1. In other words, if the target impedance in this embodiment is the same as that in Comparative Example 1, the sum of the inductance value of the first inductor L11 and the inductance value of the second inductor L12, that is, the inductance value of the inductor L1 can be made smaller in this embodiment than the inductance value of the inductor L1x according to Comparative Example 1.

The trajectory from the location D2 to the location E2 is also shortened, and thus the capacitance value of the capacitor C can also be lowered. Accordingly, the loss in the capacitor C can be reduced, and the NF can be improved. In addition, since the capacitor C draws a small arc trajectory, the movement trajectory of the impedance per spectrum space is shortened, and thus the band width enabling the matching is increased. That is, the band allowing the amplifier circuit 100 to operate with the favorable matching and gain can be kept wide.

Note that the first inductor L11 is integrated into the IC device 20 and thus has a low Q factor. However, in this embodiment, not only the first inductor L11 but also the second inductor L12 are used to form the inductor L1. The inductance value of the first inductor L11 is thus lowered more easily than in a case where only an inductor integrated into the IC device 20 is used to form the inductor L1. Accordingly, the influence of the lowness of the Q factor is reduced compared with the case where only the inductor integrated into the IC device 20 is used to form the inductor L1, the loss due to the first inductor L11 can be refrained, and the NF deterioration can also be refrained. Further, in this embodiment, the inductance value of the first inductor L11 is smaller than the inductance value of the second inductor L12. Accordingly, since the influence of the lowness of the Q factor of the first inductor L1 is further reduced, the loss in the amplifier circuit 100 can be further restrained, and the NF deterioration can also be further restrained.

The first inductor L11 having the low Q factor draws the trajectory inward of the constant resistance circle in the Smith chart because the first inductor L11 has the resistance component. Accordingly, the location B2 is located closer to the center. Each of the inductance value of the second inductor L12 and the capacitance value of the capacitor C can thus be lowered. An effect of restraining the increase in loss exerted by the second inductor L12 and the capacitor C surpasses the increase in loss influenced by the Q factor of the first inductor L11, and thus the increase in loss and the NF deterioration can be restrained as a whole in the amplifier circuit 100.

In this embodiment, the first inductor L11 integrated into the IC device 20 has a smaller inductance value than that in a case where all of the inductors connected in series to the input terminal of the transistor Tr1 are integrated into the IC device 20. Accordingly, the first inductor L11 can be downsized, and thus the IC device 20 can be restrained from becoming larger.

4. Summarization

As described above, the amplifier circuit 100 according to this embodiment that is an amplifier circuit that amplifies a high frequency signal includes the amplifier integrated into the IC device 20 and the inductor L1 connected in series to the input terminal of the amplifier. The inductor L1 includes the first inductor L11 integrated into the IC device 20 and the second inductor L12 connected in series to the first inductor L11 and included in the first component 30 different from the IC device 20.

This can restrain the deterioration of the NF and the amplification factor in the amplifier circuit 100. Specifically, as illustrated in FIG. 5, the first inductor L11 integrated into the IC device 20 causes the input impedance to be located near the center, and thus a distance of the input impedance movement in the circumferential direction caused by the parasitic capacitance Cs in the Smith chart can be shortened. Accordingly, since the inductance value of the second inductor L12 for the input impedance matching can be lowered, the increase in loss and the NF deterioration can be restrained.

According to this embodiment as descried above, the first inductor L11 is included in the IC device 20, and thereby the decrease in the input impedance due to the parasitic capacitance Cs can be restrained. Accordingly, also in the case where a part of the inductor for input matching in the amplifier circuit 100 is formed by using the external component such as the second inductor L12 formed outside the IC device 20, the decrease in the input impedance is restrained, and at the same time the increase in loss can be restrained in such a manner that the Q factor of the inductor for the input matching circuit in the amplifier circuit 100 is kept relatively high. As the result, the deterioration of the characteristics such as the gain of the amplifier circuit 100 can be restrained.

Integrating a part of the inductor L1 into the IC device 20 and including the remaining part in the external first component 30 restrain the IC device 20 from being larger. Since the IC device 20 can be downsized, more devices can be taken out from the substrate, and the cost reduction is also achieved.

In addition, for example, the amplifier circuit 100 further includes the substrate 10 having the IC device 20 and the first component 30 mounted thereabove. The IC device 20 is mounted above the substrate 10 with the bumps 70 interposed therebetween.

The mounting of the IC device 20 above the substrate 10 thereby inevitably causes the appearance of the parasitic capacitance Cs. In this embodiment, the first inductor L11 is integrated into the IC device 20, and thereby the input impedance moves in advance close to the center of the Smith chart. The moving in the circumferential direction caused by the parasitic capacitance Cs can thus be restrained. The increase in loss and the NF deterioration in the amplifier circuit 100 can thus be restrained.

Note that the mounting performed by interposing the bumps enables the IC device 20 and the external first component 30 to be reflown simultaneously, and the manufacturing process is simplified. In addition, the amplifier circuit 100 can be restrained from becoming tall and large compared with the case of connection by the wire bonding. That is, the amplifier circuit 100 can be downsized.

Moreover, for example, the amplifier includes the field effect transistor.

The use of the FET thereby enables a superior NF to that of the Si bipolar transistor to be achieved at a high frequency. In particular, for a usage in which a large number of signals are handled, such as a usage in a mobile phone, the influence of the third order distortion in cross-modulation, intermodulation, or the like can be reduced. A FET has a property in which the input impedance is localized on the conductance; however, according to this embodiment, the increase in loss and the NF deterioration can be restrained, and at the same time the input impedance matching can be performed appropriately.

For example, the inductance value of the first inductor L11 is equal to or smaller than the inductance value of the second inductor L12.

The first inductor L11 integrated into the IC device 20 can thereby be downsized, and thus the IC device 20 can be restrained from becoming larger. In addition, the influence of the lowness of the Q factor of the first inductor L11 can be reduced, and thus the increase in loss and the NF deterioration can be restrained as a whole in the amplifier circuit 100.

5. Modifications

Modifications of Embodiment 1 will be described. Each modification described below is different from Embodiment 1 in that the winding axis direction of the first inductor L11 integrated into the IC device 20 and the winding axis direction of the second inductor L12 included in the first component 30 have a predetermined relationship. Hereinafter, the point of the difference from Embodiment 1 is mainly described, and the description of a common point is omitted or simplified.

5-1. Modification 1

Figure 6:
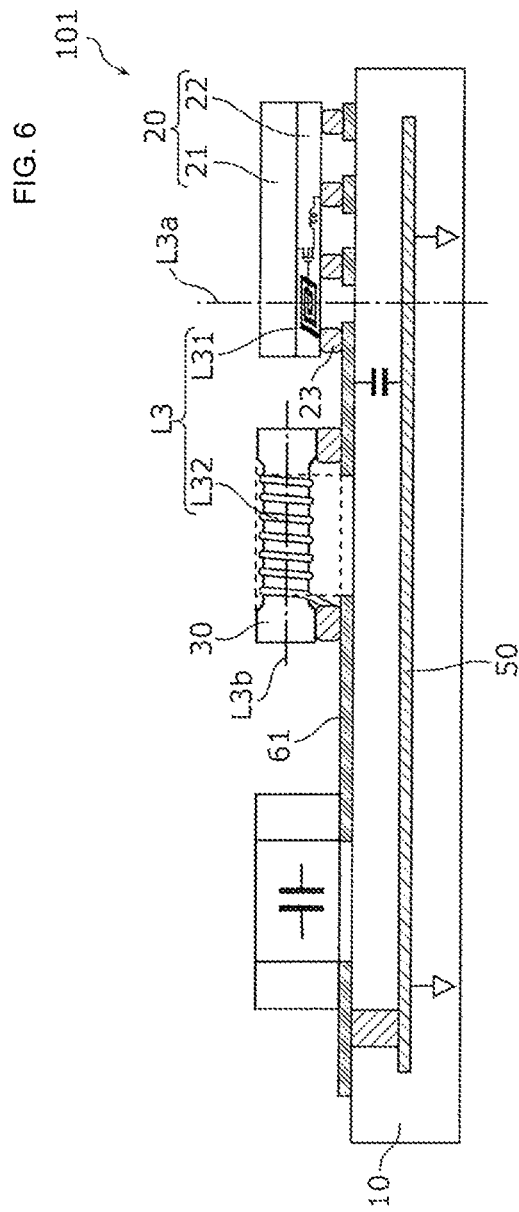
FIG. 6 is a cross-sectional view illustrating the configuration of an amplifier circuit according to Modification 1 of Embodiment 1.

First, an amplifier circuit according to Modification 1 will be described by using FIG. 6. FIG. 6 is a cross-sectional view illustrating the configuration of an amplifier circuit 101 according to Modification 1 of this embodiment.

As illustrated in FIG. 6, the amplifier circuit 101 according to this modification is different from the amplifier circuit 100 according to Embodiment 1 in that the amplifier circuit 101 includes an inductor L3 instead of the inductor L1. The inductor L3 includes a first inductor L31 integrated into the IC device 20 and a second inductor L32 included in the first component 30. Note that the amplifier circuit 101 has the same circuit configuration as the circuit configuration of the amplifier circuit 100 illustrated in FIG. 1.

The first inductor L31 is a spiral inductor that is the same as the first inductor L11 according to Embodiment 1 and that is formed inside the IC device 20, specifically, on the circuit board of the IC device 20.

FIG. 6 illustrates a winding axis direction L3a of the first inductor L31 by using an alternate long and short dashed line. The winding axis direction L3a is perpendicular to the main surface of the high resistance Si substrate 21 of the IC device 20. In this modification, the winding axis direction L3a is perpendicular to the mounting surface of the substrate 10.

The second inductor L32 is included in the first component 30. The second inductor L32 is, for example, a chip inductor included in the first component 30 that is a chip component. For example, the second inductor L32 has a configuration in which a metal thin wire formed from copper or the like is wound around a ceramic bobbin, and both ends of the metal thin wire undergo thermocompression bonding to thick-film electrodes. Since a high Q factor is easily achieved in a wound inductor using the metal thin wire, the NF of the amplifier circuit 101 can be improved.

Note that the configuration of the second inductor L32 is not limited to this configuration, and the second inductor L32 may be an inductor using thick-film electrode as a coil. The inductor using the thick-film electrode as the coil is easily downsized. The configuration of the second inductor L32 may be appropriately selected in accordance with the performance required for the amplifier circuit 101.

FIG. 6 illustrates a winding axis direction L3b of the second inductor L32 by using an alternate long and short dashed line. The winding axis direction L3b is orthogonal to the winding axis direction L3a of the first inductor L31. The winding axis direction L3b of the second inductor L32 is parallel to, for example, the long sides of the chip component. Note that FIG. 6 illustrates an outward form of the first component 30 that is the chip component by using the broken line.

Since the winding axis direction L3a of the first inductor L31 is orthogonal to the winding axis direction L3b of the second inductor L32, a magnetic flux caused by the first inductor L31 is orthogonal to a magnetic flux caused by the second inductor L32. Accordingly, the first inductor L31 and the second inductor L32 do not cause mutual induction in which the magnetic fluxes of thereof are mutually enhanced or diminished. Accordingly, the respective inductance values of the first inductor L31 and the second inductor L32 are not raised or lowered from the design values, and the matching operation according to the design is expectable. In addition, there is no need for raising the inductance values to compensate the lowering of the inductance values caused by the mutually diminished magnetic fluxes, and thus the NF deterioration can be restrained.

Note that an angle made by two directions denoted by the term "orthogonal" or "perpendicular" is not limited to an angle of only 90° but may be in a range where the angle can be regarded substantially as "orthogonal" or "perpendicular". For example, an angle in a range from 85° to 95° made by the two directions can be regarded as an angle "orthogonal" or "perpendicular".

As described above, in the amplifier circuit 101 according to this modification, the first inductor L31 is a spiral inductor formed on the circuit board of the IC device 20. The winding axis direction L3b of the second inductor L32 is orthogonal to the winding axis direction L3a of the first inductor L31.

The mutual induction between the first inductor L31 and the second inductor L32 can thereby be restrained, and thus the operation according to the design is expectable in the amplifier circuit 101. Accordingly, the reliability of the amplifier circuit 101 can be enhanced.

5-2. Modification 2

Figure 7:
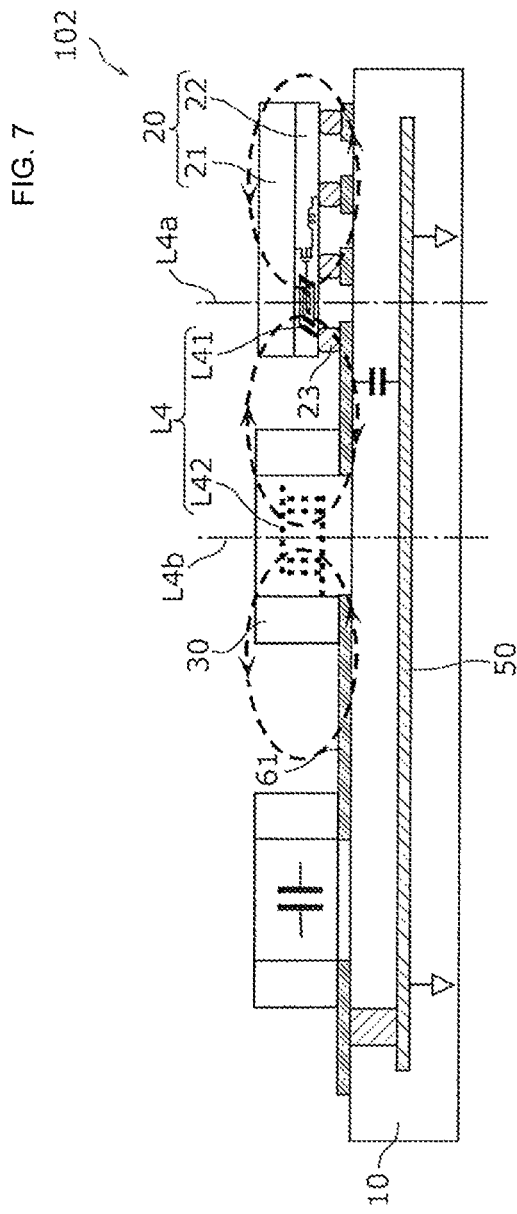
FIG. 7 is a cross-sectional view illustrating the configuration of an amplifier circuit according to Modification 2 of Embodiment 1.

An amplifier circuit according to Modification 2 will be described by using FIG. 7. FIG. 7 is a cross-sectional view illustrating the configuration of an amplifier circuit 102 according to Modification 2 of this embodiment.

As illustrated in FIG. 7, the amplifier circuit 102 according to this modification is different from the amplifier circuit 100 according to Embodiment 1 in that the amplifier circuit 102 includes an inductor L4 instead of the inductor L1. The inductor L4 includes a first inductor L41 integrated into the IC device 20 and a second inductor L42 included in the first component 30. Note that the amplifier circuit 102 has the same circuit configuration as the circuit configuration of the amplifier circuit 100 illustrated in FIG. 1.

The first inductor L41 is a spiral inductor that is the same as the first inductor L11 according to Embodiment 1 and that is formed on the circuit board of the IC device 20.

FIG. 7 illustrates a winding axis direction L4a of the first inductor L41 by using an alternate long and short dashed line. The winding axis direction L4a is perpendicular to the main surface of the high resistance Si substrate 21 of the IC device 20. In this modification, the winding axis direction L4a is perpendicular to the mounting surface of the substrate 10.

The second inductor L42 is included in the first component 30. The second inductor L42 is, for example, a chip inductor included in the first component 30 that is the chip component. Note that the second inductor L42 may be an IPD inductor.

FIG. 7 illustrates a winding axis direction L4b of the second inductor L42 by using an alternate long and short dashed line. The winding axis direction L4b is parallel to the winding axis direction L4a of the first inductor L41. Specifically, the winding axis direction L4b of the second inductor L42 is perpendicular to the mounting surface of the substrate 10.

In this modification, the winding direction of the second inductor L42 is the same as the winding direction of the first inductor L41. Accordingly, the second inductor L42 is mutually coupled with the first inductor L41, and the inductance values are raised. In FIG. 7, the directions of the respective magnetic fluxes caused by the first inductor L41 and the second inductor L42, respectively, are depicted by using the respective broken line arrows.

Note that the state where "the winding direction of the first inductor and the winding direction of the second inductor are identical" in this specification denotes one of the following two states. The two states are: (i) a state when viewed in the same direction, where the winding direction of a first inductor is a clockwise direction around the winding axis of the first inductor and where the winding direction of a second inductor is also the clockwise direction around the winding axis of the second inductor; and (ii) a state when viewed in the same direction, the winding direction of the first inductor is a counterclockwise direction around the winding axis of the first inductor and where the winding direction of the second inductor is also the counterclockwise direction around the winding axis of the second inductor.

Since the magnetic flux directions are identical in the first inductor L41 and the second inductor L42, the magnetic fluxes thereof are enhanced to each other. Accordingly, designing the first inductor L41 and the second inductor L42 to raise the inductance at a desired frequency in the mutual induction enables the inductance values to be raised without lengthening the coils and increasing the resistance components.

As described above, in the amplifier circuit 102 according to this modification, the first inductor L41 is, for example, a spiral inductor formed on the circuit board of the IC device 20. The winding axis direction L4b of the second inductor L42 is parallel to the winding axis direction L4a of the first inductor L41. The winding direction of the second inductor L42 is the same as the winding direction of the first inductor L41.

The Q factor of the inductor L4 can thereby be raised, and thus the NF deterioration in the amplifier circuit 102 can be restrained.

Embodiment 2

Embodiment 2 will be described. An amplifier circuit according to Embodiment 2 is different from that of Embodiment 1 in that the amplifier circuit includes a shunt inductor instead of the shunt capacitor. Hereinafter, the point of the difference from Embodiment 1 is mainly described, and the description of a common point is omitted or simplified.

1. Configuration

Figure 8:
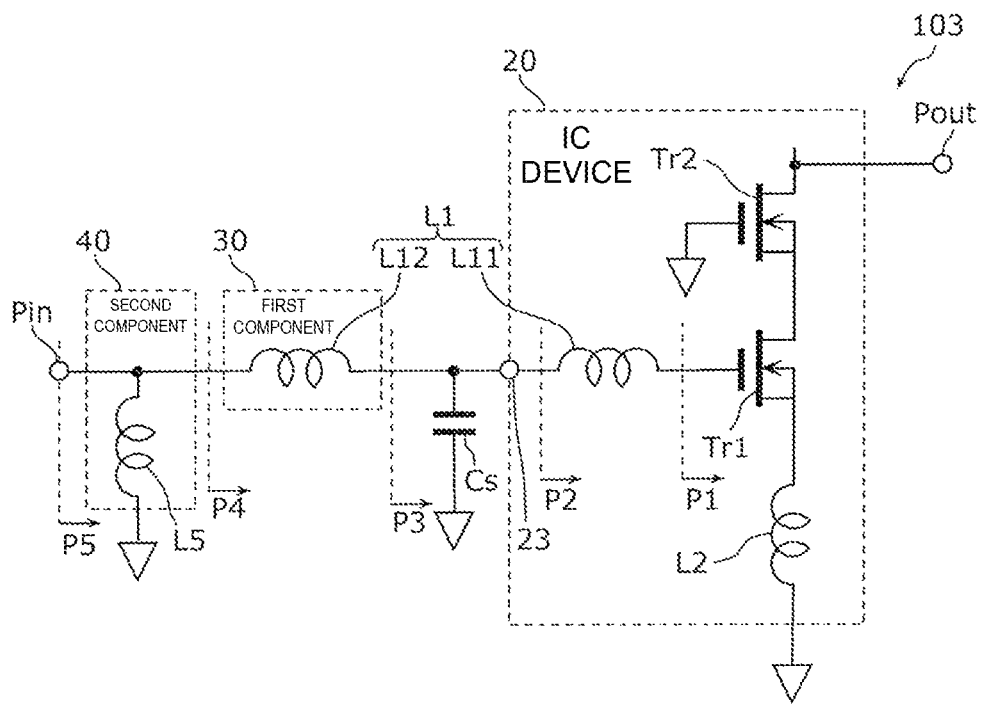
FIG. 8 is a circuit diagram of an amplifier circuit according to Embodiment 2.

FIG. 8 is a circuit diagram of an amplifier circuit 103 according to this embodiment. As illustrated in FIG. 8, the amplifier circuit 103 is different from the amplifier circuit 100 according to Embodiment 1 in that the amplifier circuit 103 includes an inductor L5 instead of the capacitor C.

The inductor L5 is a shunt inductor grounded at one end thereof. The other end of the inductor L5 is connected to the input terminal Pin of the amplifier circuit 103. The inductor L5 is included in, for example, the second component 40. The inductor L5 is, for example, a chip inductor.

The specific configuration of the amplifier circuit 103 is the same as the configuration illustrated in FIG. 2. Specifically, a difference lies in that the inductor L5 instead of the capacitor C is formed in the second component 40. Note that the inductor L5 may be included in the first component 30, like the second inductor L12. The amplifier circuit 103 thereby does not have to include the second component 40, and it is thus possible to reduce the number of components and achieve the downsizing and weight reduction.

2. Configuration and Trouble in Comparative Example 2

The configuration of the amplifier circuit according to Comparative Example 2 will be described by using FIG. 9.

Figure 9:
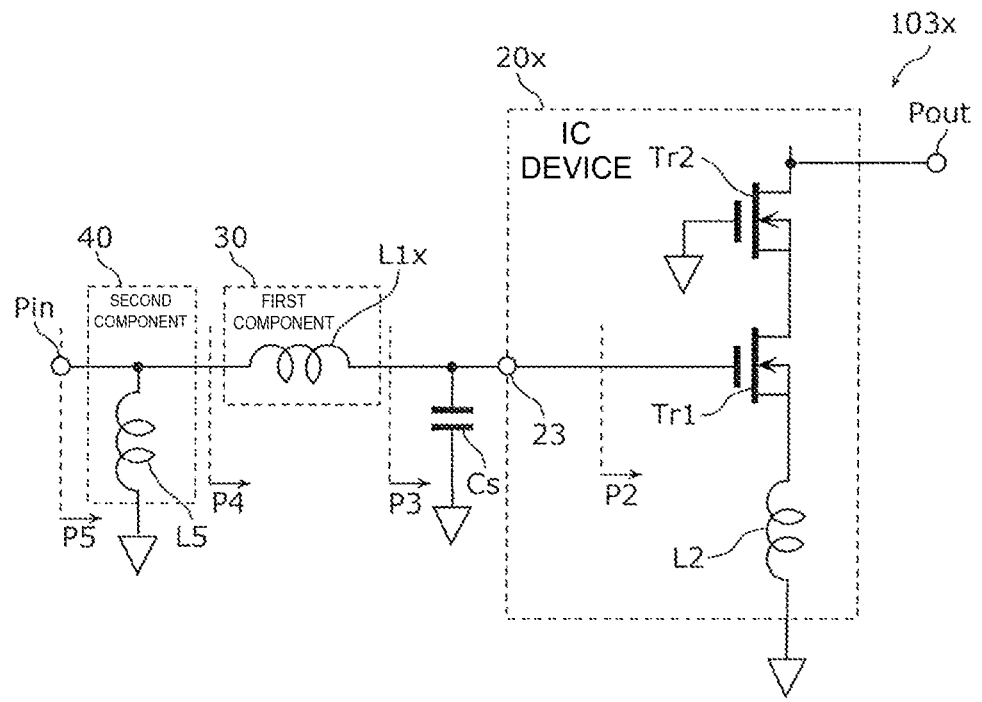
FIG. 9 is a circuit diagram of an amplifier circuit according to Comparative Example 2.

FIG. 9 is a circuit diagram of an amplifier circuit $103x$ according to Comparative Example 2. As illustrated in FIG. 9, the amplifier circuit $103x$ according to Comparative Example 2 is different from the amplifier circuit 103 according to Embodiment 2 in that an inductor is not integrated into the IC device $20x$. In other words, the amplifier circuit $103x$ is different from the amplifier circuit $100x$ according to Comparative Example 1 in that the amplifier circuit $103x$ includes the inductor L5 instead of the capacitor C.

Figure 10:
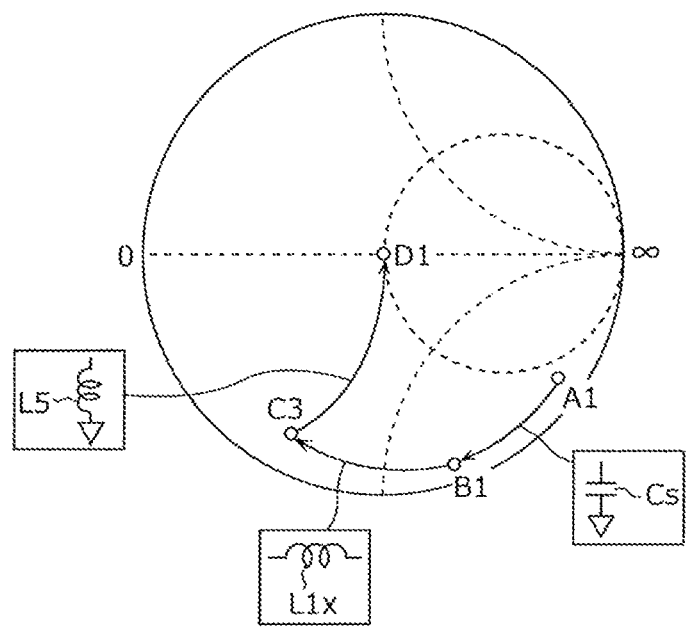
FIG. 10 is a Smith chart for explaining the input impedance matching in the amplifier circuit according to Comparative Example 2.

FIG. 10 is a Smith chart for explaining the input impedance matching in the amplifier circuit $103x$ according to Comparative Example 2. As illustrated in FIG. 10, in the amplifier circuit $103x$ according to Comparative Example 2, the parasitic capacitance Cs causes the location B1 to be closer to the circumference than the location A1 is. This causes a long trajectory from the location B1 to a location C3 caused by the inductor $L1x$.

Since the location B1 is located closer to the circumference than the location A1 is at this time in Comparative Example 2, the inductance value of the inductor $L1x$ needed for moving the input impedance to the location C3 enabling the matching in the inductor L5 is raised. Accordingly, the series resistance component included in the inductor $L1x$ causes an increase in loss in the amplifier circuit 100, and thus the NF is deteriorated.

Since the inductance value of the inductor L5 needed for moving from the location C3 to the location D1 is also raised, the loss in the inductor L5 is also increased, and the NF is deteriorated. Further, the movement trajectory of the impedance per spectrum space is lengthened, and thus the band width enabling the matching is reduced. That is, the band allowing the amplifier circuit $103x$ to operate with the favorable matching and gain is reduced.

3. Advantageous Effects

To address the trouble with the amplifier circuit $103x$ according to Comparative Example 2 described above, a part of the inductor L1 is integrated into the IC device 20 in the amplifier circuit 103 according to this embodiment, and the remaining part is included in the external first component 30, as described above. The increase in loss, the NF deterioration, and the operating band reduction can thereby be restrained. Detailed description is hereinafter provided by using FIG. 11.

Figure 11:
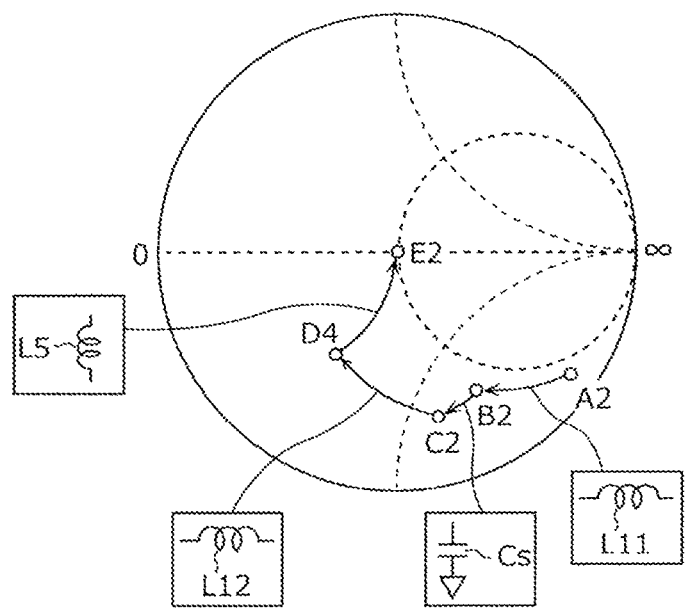
FIG. 11 is a Smith chart for explaining the input impedance matching in the amplifier circuit according to Embodiment 2.

FIG. 11 is a Smith chart for explaining the input impedance matching in the amplifier circuit 103 according to this embodiment. The input impedance of the gate of the transistor Tr1 is located in the location A2 and is the same as the location A1 illustrated in FIG. 10 in the case of the amplifier circuit $103x$ according to Comparative Example 2.

In the amplifier circuit 103 according to this embodiment, like the amplifier circuit 100 according to Embodiment 1, the input impedance moves from the location A2 to the location B2 and then to the location C2. The location B2 is farther from the circumference than the location A2 is and is located closer to the center. Accordingly, the location C2 in FIG. 11 is located closer to the center than the location B1 in FIG. 10 is.

Since the second inductor L12 is connected in series to the first inductor L11 as illustrated in FIG. 11, the input impedance observed from P4 then moves clockwise along the constant resistance circle from the location C2 to a location D4. Lastly, the inductor L5 causes the input impedance observed from P5 to move from the location D4 to the location E2 (for example, 50 ohms) at the center of the Smith chart.

Since the location C2 is located close to the center at this time in this embodiment, the inductance value of the second inductor L12 needed for moving the input impedance to the location D4 enabling the matching in the inductor L5 is lowered. Accordingly, like Embodiment 1, the increase in loss in the amplifier circuit 103 due to the series resistance component included in the second inductor L12 can be restrained.

Since the trajectory of moving from the location D4 to the location E2 is also shortened, the inductance value of the inductor L5 can also be lowered. Accordingly, loss in the inductor L5 can be reduced, and the NF can be improved. In addition, since the inductor L5 draws a small arc movement trajectory, the trajectory per spectrum space is shortened, and thus the band width enabling the matching is increased. That is, the band allowing the amplifier circuit 103 to operate with the favorable matching and gain can be kept wide.

As described above, also in the case of using the shunt inductor instead of the shunt capacitor, the deterioration of the NF and the amplification factor in the amplifier circuit 103 can be restrained.

Other Embodiments

The amplifier circuit according to each embodiment of the present disclosure has heretofore been described based on the embodiment described above; however, the embodiment of the present disclosure is not limited to the above-described embodiment.

For example, the first inductor L11, L31, or L41 may be a solenoid inductor having a wound wire shaped like a multilayer. Alternatively, the first inductor L11, L31, or L41 may have a structure in which the solenoid inductor and the spiral inductor are combined.

For example, the winding axis direction of the first inductor L11, L31, or L41 may obliquely cross the main surface of the high resistance Si substrate 21 or may be parallel thereto. For example, the first inductor L11, L31, or L41 may be a solenoid inductor having the winding axis direction parallel to the main surface of the high resistance Si substrate 21.

For example, the IC device 20 may be provided with a through-silicon via (TSV), and the IC input terminal 23 connected to the first inductor L11, L31, or L41 may be disposed on the back surface of the IC device 20 with the TSV interposed between the IC input terminal 23 and the first inductor L11, L31, or L41. The IC input terminal 23 disposed on the back surface of the IC device 20 and the first component 30 may be connected by wire bonding or the like.

For example, the first component 30 including the second inductor L12, L32, or L42 does not have to be mounted above the mounting surface of the substrate 10. For example, the first component 30 may be integrated into the substrate 10.

For example, the first inductor L11, L31, or L41 integrated into the IC device 20 may be a minimal chip inductor. Specifically, a space may be formed in a part of the Si layer 22 of the IC device 20, and the first inductor L11, L31, or L41 that is the minimal chip inductor may be disposed in the space.

For example, the capacitor C does not have to be included in the second component 40. For example, the capacitor C may be integrated into the substrate 10. The capacitor C may be formed by using a wiring pattern provided on the substrate 10.

For example, the amplifier circuit does not have to include each of the capacitor C and the inductor L5 that are for shunting. For example, the inductance value of the first inductor L1, the capacitance value of the parasitic capacitance Cs, or the like is controlled, and thereby the location C2 illustrated in FIG. 5 is made to be located on the constant resistance circle including the location E2 or near the constant resistance circle. The second inductor L12 can thereby cause the input impedance observed from P4 (or P5) in FIG. 1 or 8 to move from the location C2 to the location E2.

For example, the transistor Tr1 or Tr2 may be a p-channel MOSFET. Alternatively, the transistor Tr1 or Tr2 may be a junction FET (JFET).

The transistor Tr1 or Tr2 may also be a bipolar transistor. In this case, the base, the emitter, and the collector of the bipolar transistor respectively correspond to the gate, the source, and the drain of the FET. For example, the transistor Tr1 or Tr2 may also be a SiGe bipolar transistor.

In addition to the above-described embodiments, a mode obtained by making any of various modifications conceived of by those skilled in the art to any of the embodiments and a mode achieved by performing any combination of the components and the functions in the embodiments without departing from the spirit of the present disclosure are included in the embodiments of the present disclosure.

Each embodiment of the present disclosure is usable as an amplifier circuit enabled to restrain the deterioration of a NF and an amplification factor and can be widely used, for example, for communication equipment such as a mobile phone as an amplifier circuit for a high-frequency module installed in a multiband compatible front-end portion.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An amplifier circuit configured to amplify a high frequency signal, comprising:
    an amplifier;
    an inductor connected in series to an input terminal of the amplifier, wherein:
        the amplifier is integrated in an integrated circuit device, and
        the inductor includes:
            a first inductor integrated into the integrated circuit device and
            a second inductor connected in series to the first inductor and included in a component different from the integrated circuit device;
    a mounting substrate above which the integrated circuit device and the component are mounted,
    wherein the integrated circuit device is mounted above the mounting substrate with a bump interposed between the integrated circuit device and the mounting substrate,
    wherein the integrated circuit device includes a circuit board, and
    wherein the first inductor is a spiral inductor provided at the circuit board of the integrated circuit device.

2. The amplifier circuit according to claim 1,
    wherein a winding axis direction of the second inductor is orthogonal to a winding axis direction of the first inductor.

3. The amplifier circuit according to claim 1,
    wherein a winding axis direction of the second inductor is parallel to a winding axis direction of the first inductor, and
    wherein a winding direction of the second inductor is identical to a winding direction of the first inductor.

4. The amplifier circuit according to claim 1,
    wherein the amplifier includes a field effect transistor.

5. The amplifier circuit according to claim 1,
    wherein an inductance value of the first inductor is equal to or smaller than an inductance value of the second inductor.

6. The amplifier circuit according to claim 1,
    wherein a winding axis direction of the second inductor is orthogonal to a winding axis direction of the first inductor.

7. The amplifier circuit according to claim 1,
    wherein a winding axis direction of the second inductor is parallel to a winding axis direction of the first inductor, and
    wherein a winding direction of the second inductor is identical to a winding direction of the first inductor.

8. The amplifier circuit according to claim 1,
    wherein the amplifier includes a field effect transistor.

9. The amplifier circuit according to claim 2,
    wherein the amplifier includes a field effect transistor.

10. The amplifier circuit according to claim 3,
    wherein the amplifier includes a field effect transistor.

11. The amplifier circuit according to claim 2,
    wherein an inductance value of the first inductor is equal to or smaller than an inductance value of the second inductor.

12. The amplifier circuit according to claim 3,
    wherein an inductance value of the first inductor is equal to or smaller than an inductance value of the second inductor.

13. The amplifier circuit according to claim 4,
    wherein an inductance value of the first inductor is equal to or smaller than an inductance value of the second inductor.

14. An amplifier circuit configured to amplify a high frequency signal, comprising:
    an amplifier;
    an inductor connected in series to an input terminal of the amplifier, wherein:
        the amplifier is integrated in an integrated circuit device,
        the inductor includes:
            a first inductor integrated into the integrated circuit device and
            a second inductor connected in series to the first inductor and included in a component different from the integrated circuit device; and
    a mounting substrate above which the integrated circuit device and the component are mounted, and
    wherein the integrated circuit device is mounted above the mounting substrate with a bump interposed between the integrated circuit device and the mounting substrate.

15. An amplifier circuit configured to amplify a high frequency signal, comprising:
an amplifier; and
an inductor connected in series to an input terminal of the amplifier, wherein:
the amplifier is integrated in an integrated circuit device,
the inductor includes:
a first inductor integrated into the integrated circuit device and
a second inductor connected in series to the first inductor and included in a component different from the integrated circuit device,
the integrated circuit device includes a circuit board,
the first inductor is a spiral inductor provided at the circuit board of the integrated circuit device, and
a winding axis direction of the second inductor is orthogonal to a winding axis direction of the first inductor.

* * * * *